(12) United States Patent
Sun et al.

(10) Patent No.: US 10,730,705 B2
(45) Date of Patent: Aug. 4, 2020

(54) LOADING AND UNLOADING DEVICE FOR A SOLID STATE DISK TEST SYSTEM

(71) Applicant: World Precision Manufacturing (Dongguan) Co., Ltd., Dongguan (CN)

(72) Inventors: Jinsuo Sun, Dongguan (CN); Shengkai Wang, Dongguan (CN); Hongliang Yang, Dongguan (CN); Jianhong Zhou, Dongguan (CN); Benzhan Wu, Dongguan (CN)

(73) Assignee: WORLD PRECISION MANUFACTURING (DONGGUAN) CO., LTD., Dongguan (CN)

( * ) Notice: Subject to any disclaimer, the term of this patent is extended or adjusted under 35 U.S.C. 154(b) by 154 days.

(21) Appl. No.: 16/142,557

(22) Filed: Sep. 26, 2018

(65) Prior Publication Data

US 2019/0023502 A1    Jan. 24, 2019

(30) Foreign Application Priority Data

Mar. 28, 2018   (CN) .......................... 2018 1 0265826

(51) Int. Cl.
| | | |
|---|---|---|
| *B65G 47/90* | (2006.01) | |
| *G11C 29/56* | (2006.01) | |
| *G01R 31/28* | (2006.01) | |
| *H05K 7/18* | (2006.01) | |

(52) U.S. Cl.
CPC ....... *B65G 47/905* (2013.01); *G01R 31/2867* (2013.01); *G01R 31/2893* (2013.01); *G11C 29/56016* (2013.01); *H05K 7/18* (2013.01)

(58) Field of Classification Search
CPC .. H05K 7/18; G01R 31/2867; G01R 31/2893; B65G 47/905; G11C 29/56016
USPC ........................................................ 209/651
See application file for complete search history.

(56) References Cited

U.S. PATENT DOCUMENTS

| | | | | |
|---|---|---|---|---|
| 6,614,519 | B1* | 9/2003 | Latta | G01N 21/9506 356/237.1 |
| 8,405,971 | B2* | 3/2013 | Merrow | G11B 17/225 361/679.34 |
| 8,467,180 | B2* | 6/2013 | Merrow | G11B 33/128 361/679.34 |
| 2006/0269384 | A1* | 11/2006 | Kiaie | B25J 9/0096 414/222.02 |
| 2009/0142169 | A1* | 6/2009 | Garcia | B25J 15/0052 414/222.02 |
| 2009/0153994 | A1* | 6/2009 | Merrow | G06F 1/187 360/31 |

(Continued)

*Primary Examiner* — Terrell H Matthews
(74) *Attorney, Agent, or Firm* — Shimokaji IP

(57) ABSTRACT

A loading and unloading device of solid state disk test system is used for picking and placing solid state disks at a test position. The device includes a sorting and feeding device and a transfer device including a transfer mechanism and an insert and extract robot. A loading and unloading position is located at the side of the sorting and feeding device away from the transfer device. The sorting and feeding device transfers the solid state disk to be tested from the loading and unloading position to a side close to the transfer device, and transfers the tested solid state disk back. The transfer mechanism drives the insert and extract robot to move relative to the test position to insert the solid state disk to be tested into the test position, which pulls out the tested solid state disk to transfer to the transfer device.

10 Claims, 12 Drawing Sheets

(56) References Cited

U.S. PATENT DOCUMENTS

2009/0234500 A1* 9/2009 Tanaka ............... G11B 15/6835
700/250
2013/0258328 A1* 10/2013 Sugimoto .............. G01N 21/95
356/237.2

* cited by examiner

LOADING AND UNLOADING DEVICE FOR A SOLID STATE DISK TEST SYSTEM

RELATED APPLICATIONS

This application claims the benefit of priority to Chinese Patent Application No. 201810265826.9 filed on Mar. 28, 2018, which is hereby incorporated by reference in its entirety.

FIELD OF THE INVENTION

The present invention relates to a solid state disk test device, and more particularly to a loading and unloading device for a solid state disk test system.

BACKGROUND OF THE INVENTION

In the performance test of solid state disks, because solid state disks have difference, test time required for different solid state disks varies greatly, and test duration ranges from 30 minutes to 4 hours. To this end, a solid state disk system is provided with multiple separate test positions to test each of the solid state disks separately.

In order to improve testing efficiency of the solid state disk system, the solid state disk at the test position will be loaded and unloaded after the solid state disk at the test position finishes being tested, and then another solid state disk will be tested. However, the solid state disks at each test position require different loading and unloading times, it is a lot of work to load and unload the solid state disks at the various test positions.

Thus, it's necessary to provide a loading and unloading device for a solid state disk that can selectively insert and pull out solid state disks according to test status on various test positions, so as to load or unload quickly the solid state disks.

SUMMARY OF THE INVENTION

One objective of the present invention is to provide a loading and unloading device for a solid state disk test system that can selectively insert and pull out solid state disks according to test status on various test positions, so as to load and unload quickly the solid state disks.

To achieve the above objective, a loading and unloading device for a solid state disk test system is provided, which is adapted to insert and extract solid state disks at a test position of a solid state disk test system. The loading and unloading device includes a sorting and feeding device disposed in parallel with the solid state disk test system, and a transfer device disposed on a side of the solid state disk test system provided with a test position. A loading and unloading position is located at a side of the sorting and feeding device away from the transfer device. The sorting and feeding device transfers the solid state disk to be tested from the loading and unloading position to a side close to the transfer device, and transfers the tested solid state disk back to the loading and unloading position. The transfer device includes a transfer mechanism and an insert and extract robot. And the transfer mechanism drives the insert and extract robot to move relative to the test position, which inserts the solid state disk to be tested into the test position, or pulls out the tested solid state disk to transfer to the transfer device.

In comparison with the prior art, the sorting and feeding device of the loading and unloading device is disposed in parallel with the solid state disk test system to reduce space occupied. Besides, a transfer device is disposed on a side of the solid state disk test system provided with a test position, which can detect test status on various test positions of the solid state disk test system. According to test status on various test positions, the transfer device inserts solid state disk into the test position to load; or the transfer device pulls out the tested solid state disk from the test position to unload. The loading and unloading device for solid state disk test system can selectively insert and pull out solid state disks according to test status on various test positions, so as to load and unload the solid state disks. It is highly effective and highly automated.

Preferably, the sorting and feeding device is disposed between the solid state disk test systems whose number is at least two, and the two transfer devices are respectively disposed on a side of the solid state disk test system provided with the test position. It can be understood, the loading and unloading device operates with high efficiency compared to testing the single solid state disk for more than half an hour. In the preferred embodiment, the sorting and feeding device is disposed between at least two solid state disk test systems, so that the sorting and feeding device can simultaneously load and unload the solid state disk to at least two solid state disk test systems disposed on left and right sides of the sorting and feeding device.

Preferably, the sorting and feeding device includes a pushing mechanism, and the pushing mechanism is located at a side of the sorting and feeding device close to the transfer device and protruded from the solid state disk test system. Further, the pushing mechanism includes a transfer line extending towards the transfer device, which transfers solid state disks between the sorting and feeding device and the transfer device.

Preferably, the transfer line includes a loading transfer line and an unloading transfer line arranged in parallel, and the pushing mechanism is provided with a pushing robot at an end of the transfer line away from the transfer device, which transfers solid state disks to the loading transfer line and/or the unloading transfer line.

Preferably, the transfer line includes a loading transfer line and an unloading transfer line. The loading transfer line is provided with a sorting mechanism for identifying the solid state disk and transferring the identified solid state disk to a defective product recycling mechanism.

Preferably, the sorting and feeding device includes a feeding mechanism. At least two feeding mechanisms are arranged vertically, and the feeding mechanism and the transfer line are arranged in one-to-one correspondence, and the pushing robot transfers solid state disks between the transfer line and the feeding mechanism.

Concretely, the sorting and feeding device further includes a defective product recycling mechanism. The defective product recycling mechanism and at least two feeding mechanisms are vertically arranged, and the defective product recycling mechanism is located above at least two feeding mechanisms. The sorting and feeding device further includes a defective product recycling line, and a defective product recycling robot moves between the defective product recycling line and the defective product recycling mechanism to transfer the defective solid state disk.

Preferably, the transfer mechanism includes a rack, a top and bottom beam, and a drive member. The rack is laterally fixedly disposed on upper and lower sides of the solid state disk test system, opposite ends of the top and bottom beam are respectively engaged with the rack, and the drive member drives the top and bottom beam to mesh with the rack to transfer. An insert and extract robot is movably coupled to the top and bottom beam.

Preferably, the opposite ends of the top and bottom beam are respectively provided with rollers which are rotatable relative to the top and bottom beam, and a plurality of cylindrical pins are arranged circumferentially around an outer edge of the roller with the top and bottom as a center; and when the drive member drives the top and bottom beam to move, the top and bottom beam moves by engagement of the cylindrical pin and the rack.

Preferably, the transfer device further includes a transfer robot which is movable up and down and respectively cooperates with the transfer line or the insert and extract robot, which transfers solid state disks to the insert and extract robot or transfers the tested solid state disk back to the transfer line.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
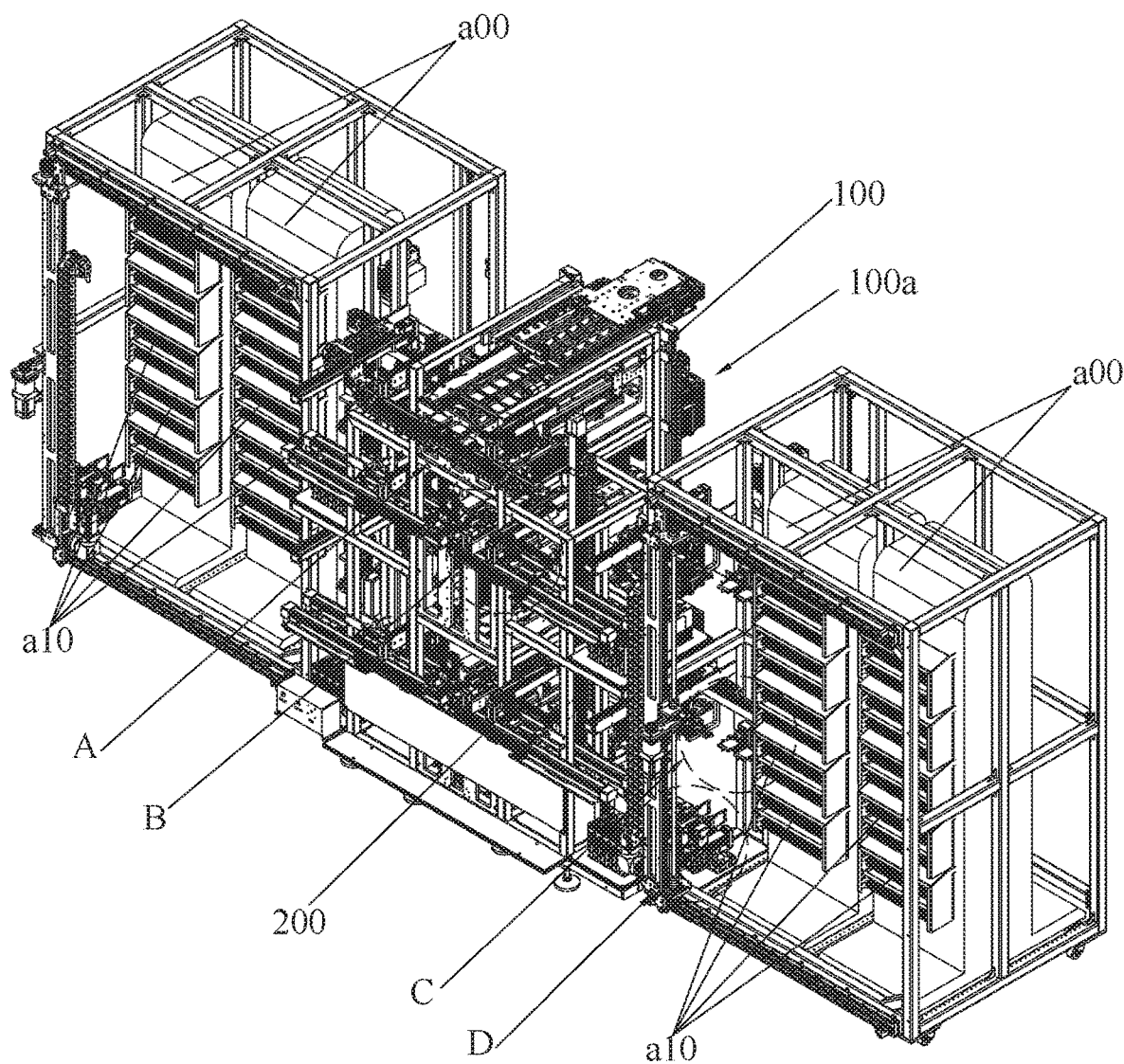
FIG. 1 is a perspective view of a loading and unloading device for a solid state disk test system according to the present invention.
Figure 2:
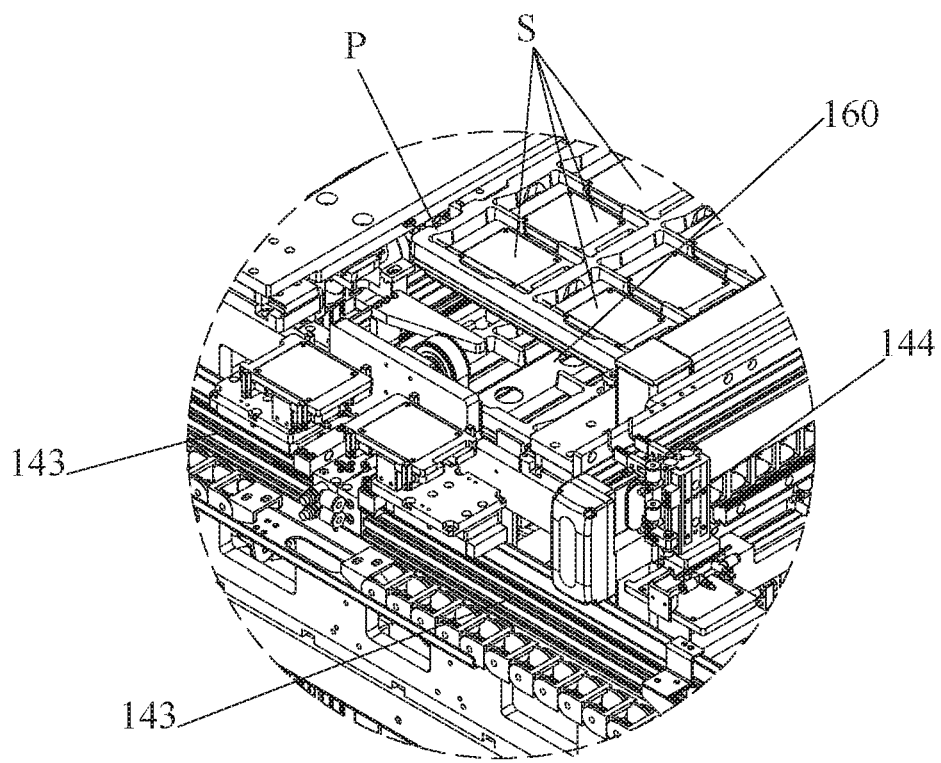
FIG. 2 is a partial enlarged view of portion A in FIG. 1.
Figure 3:
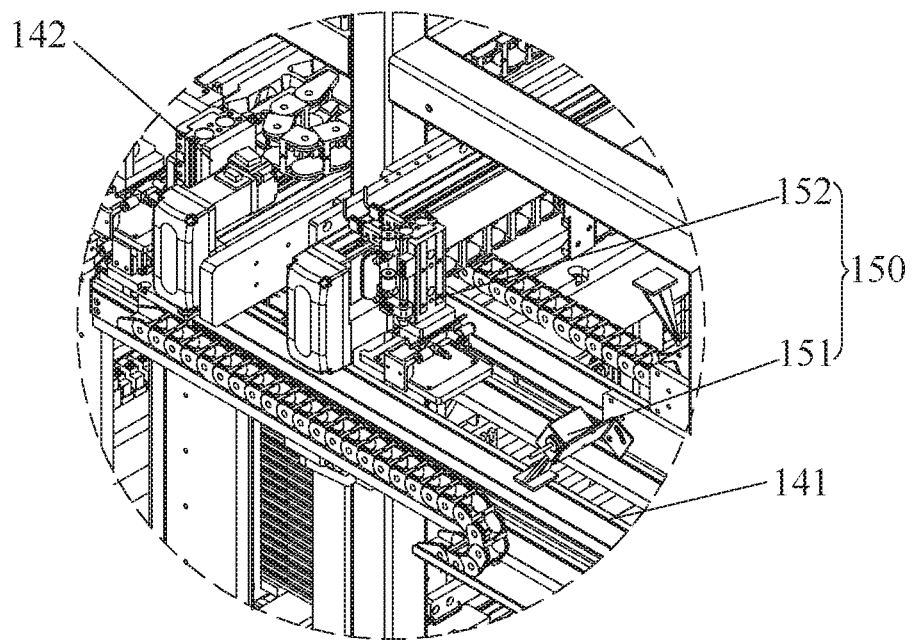
FIG. 3 is a partial enlarged view of portion B in FIG. 1.
Figure 4:
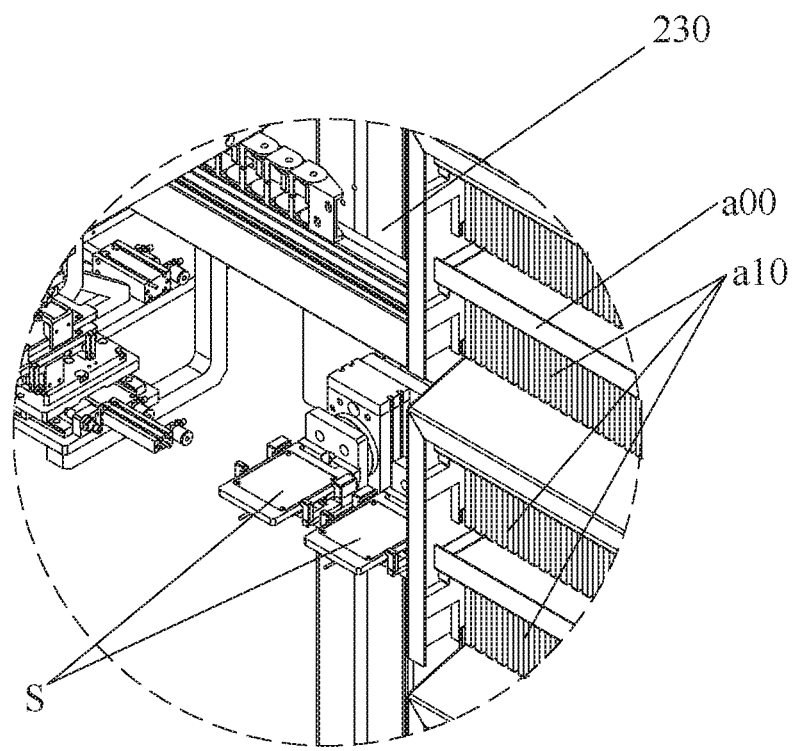
FIG. 4 is a partial enlarged view of portion C in FIG. 1.
Figure 5:
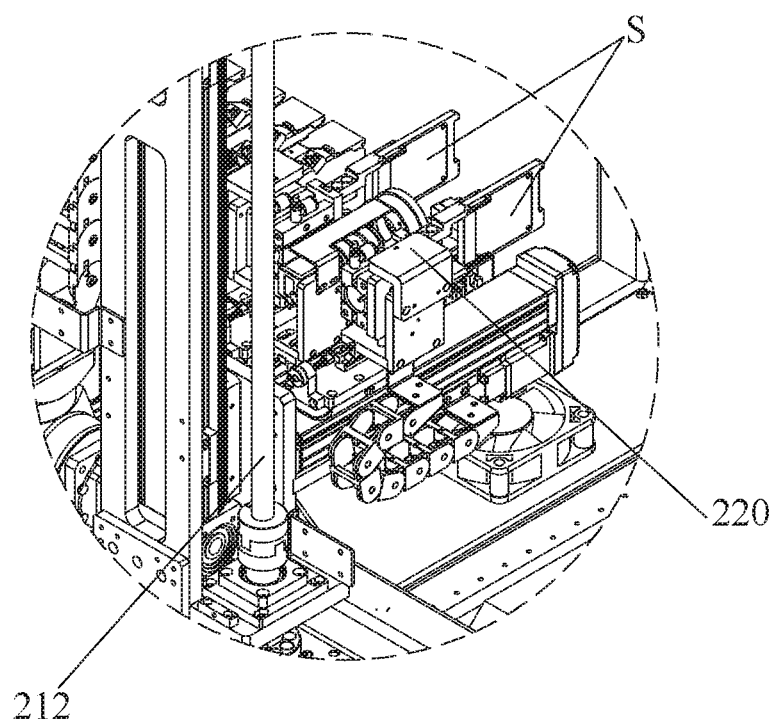
FIG. 5 is a partial enlarged view of portion D in FIG. 1.

A distinct and full description of the technical solution of the present invention will follow by combining with the accompanying drawings.

Figure 10:
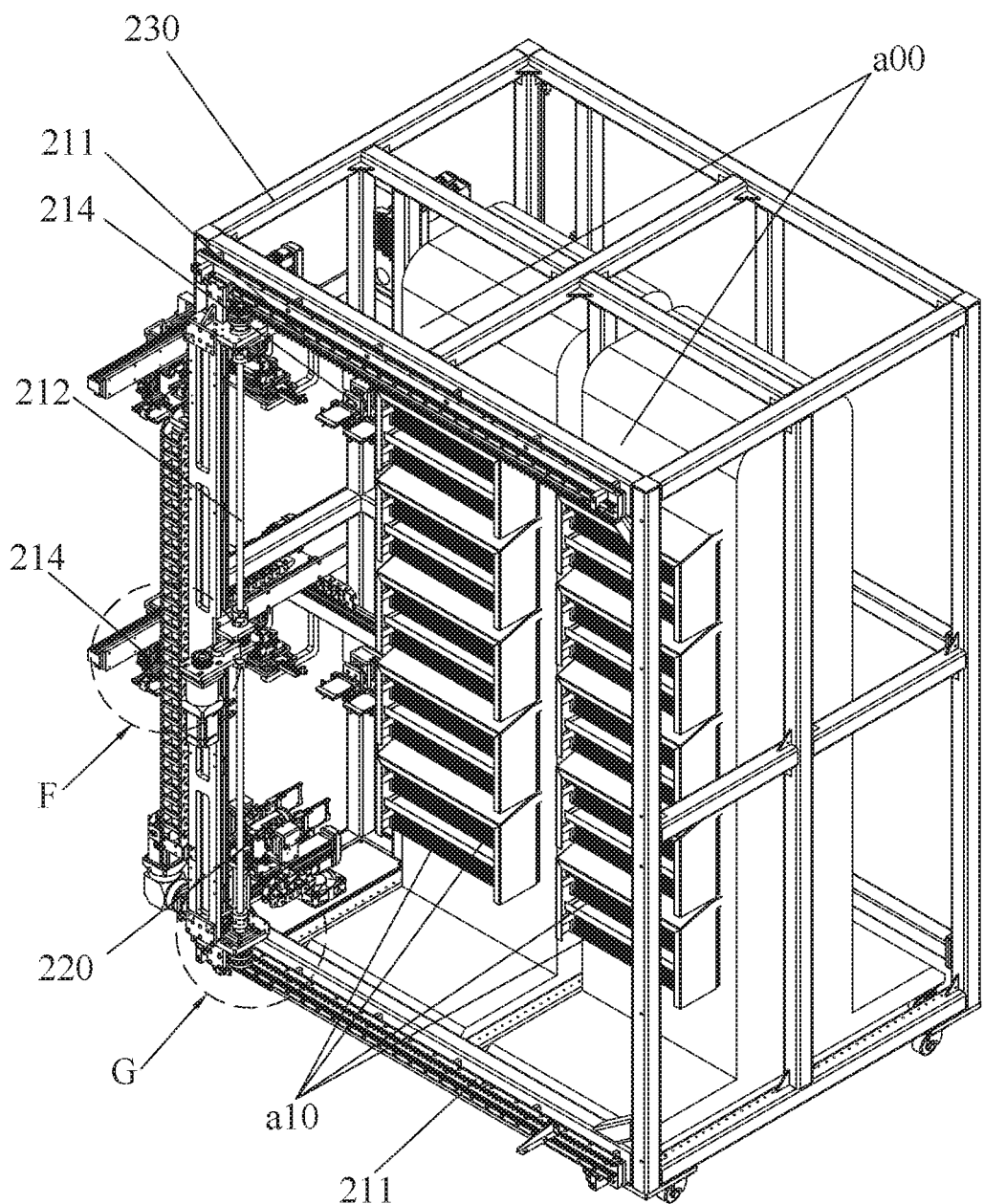
FIG. 10 is a perspective view showing a assembly structure of a transfer device and a solid state disk test system according to the present invention.
Figure 11:
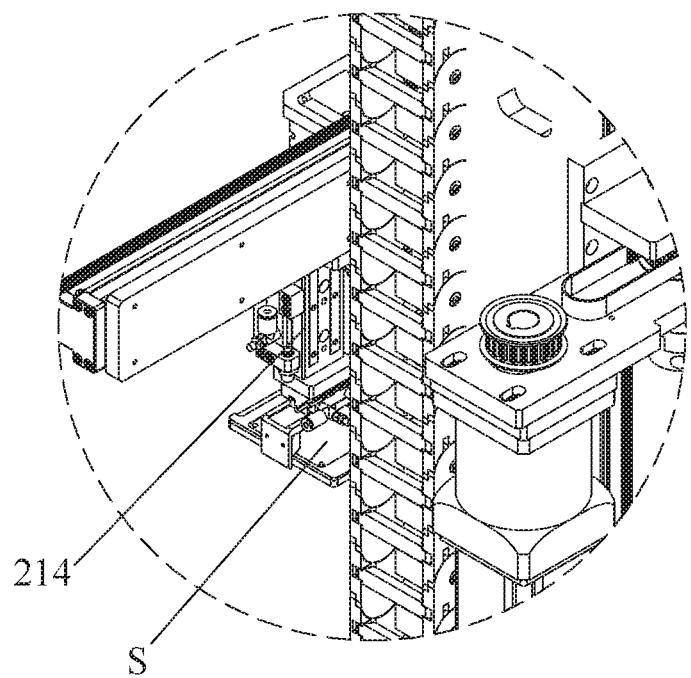
FIG. 11 is a partial enlarged view of portion F in FIG. 10.
Figure 12:
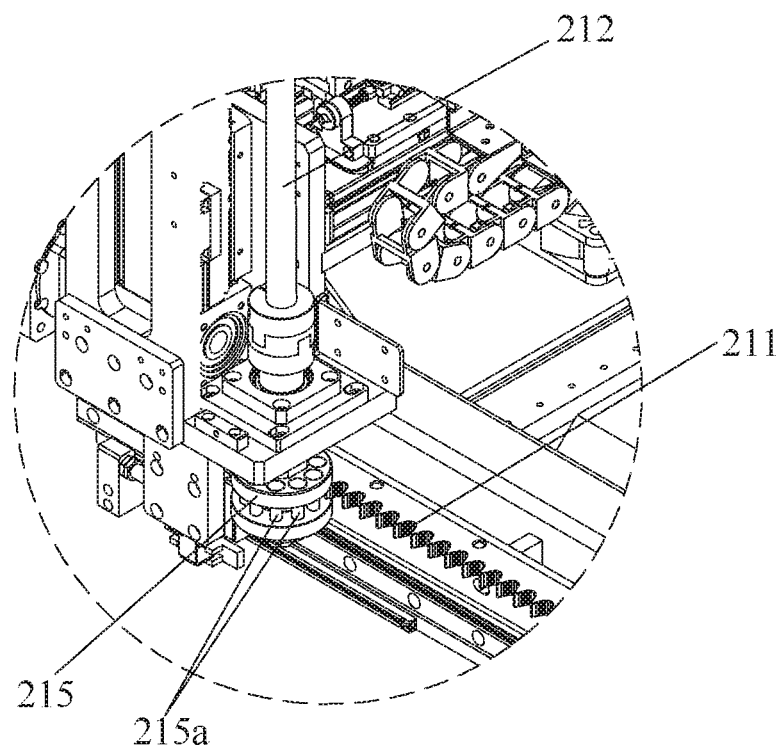
FIG. 12 is a partial enlarged view of portion G in FIG. 10.

As shown in FIG. 1 to FIG. 5, a loading and unloading device for a solid state disk test system is provided, which is adapted to insert and extract a solid state disk S at a test position a10 of a solid state disk test system a00. The loading and unloading device includes a sorting and feeding device 100 disposed in parallel with the solid state disk test system a00, and a transfer device 200 disposed on a side of the solid state disk test system a00 provided with a test position a10. A loading and unloading position 100a is located at a side of the sorting and feeding device 100 away from the transfer device 200. The sorting and feeding device 100 transfers the solid state disk S to be tested from the loading and unloading position 100a to a side close to the transfer device 200, and transfers the tested solid state disk S back to the loading and unloading position 100a. The transfer device 200 includes a transfer mechanism 210 and an insert and extract robot 220. The transfer mechanism 210 drives the insert and extract robot 220 to move relative to the test position a10 to insert the solid state disk S to be tested into the test position a10, or to pull out the tested solid state disk S and transfer it to the transfer device 200. Referring to FIGS. 6-15, more specifically:

The solid state disk test system a00 is designed for performance testing of solid state disks S. As shown in FIG. 1 and FIG. 10, the solid state disk test system a00 has a thin and high cube structure. A plurality of test positions a10 are arranged on the front side of the solid state disk test system a00, and each test position a10 has a plug-in port for a solid state disk S. Thus, the solid state disk test system a00 can simultaneously tests several solid state disks S at the test positions a10, that is, the performance tests of several solid state disks S are simultaneously performed. Besides, the performance test of each solid state disk S is independent and does not interfere with each other. According to test status on various test positions, the loading and unloading device for a solid state disk test system a00 can remove or place single solid state disk S at the test position a10 of the solid state disk test system a00.

As shown in FIG. 1, the loading and unloading device for a solid state disk test system includes a sorting and feeding device 100 and a transfer device 200. Concretely, the sorting and feeding device 100 is disposed in parallel with the solid state disk test system a00, and the transfer device 200 is disposed on the side of the solid state disk test system a00 provided with the test position a10. The sorting and feeding device 100 and the solid state disk test system a00 are arranged in parallel to effectively reduce space occupied by the sorting and feeding device 100. Besides, a transfer device 200 is disposed on a side of the solid state disk test system a00 provided with a test position a10, which can detect test status on various test positions a10 of the solid state disk test system a00. According to test status on various test positions, the transfer device 200 inserts solid state disk S into the test position a10 to load; or the transfer device 200 pulls out the tested solid state disk S from the test position a10 to unload.

Preferably, for the purpose that the transfer device 200 quickly identifies positions of the test position a10 where the solid state disk S needs to be pulled out, or where the solid state disk S needs to be inserted into, an indicator light can be set at the test position a10. The transfer device 200 is correspondingly provided with a sensor. When the corresponding indicator light is on, the transfer device 200 can identify that the solid state disk S at the test position a10 finishes being tested and need to be pulled out, or the test position a10 is vacant to be inserted into the solid state disk S to be tested. Of course, in a preferred embodiment, the solid state disk test system a00 establishes communication link with the loading and unloading device, which can directly determine position coordinates of the test position a10. Thus, before the solid state disk S at a test position a10 finishes performance test, the transfer device 200 will be moved to the test position a10 in advance, thereby further improving loading and unloading efficiency.

It can be understood, the loading and unloading device operates with high efficiency, compared to testing the single solid state hard disk S for more than half an hour. Thus, one sorting and feeding device 100 can simultaneously load and unload the solid state disks S to at least two solid state disk test systems a00. In the preferred embodiment, as shown in FIG. 1, the sorting and feeding device 100 is disposed between at least two solid state disk test system a00, so that the sorting and feeding device 100 can simultaneously load and unload the solid state disk S to at least two solid state disk test systems a00 disposed on left and right sides of the sorting and feeding device 100. Specifically, in the embodiment, the number of the solid state disk test systems a00 is four, which are respectively disposed on the left and right sides of the sorting and feeding device 100. In other embodiments, according to the number of test positions a10, test time, and loading and unloading efficiency of the sorting and feeding device 100, one sorting and feeding device 100 can load or unload the solid state disk S to six solid state disk test systems a00.

Figure 6:
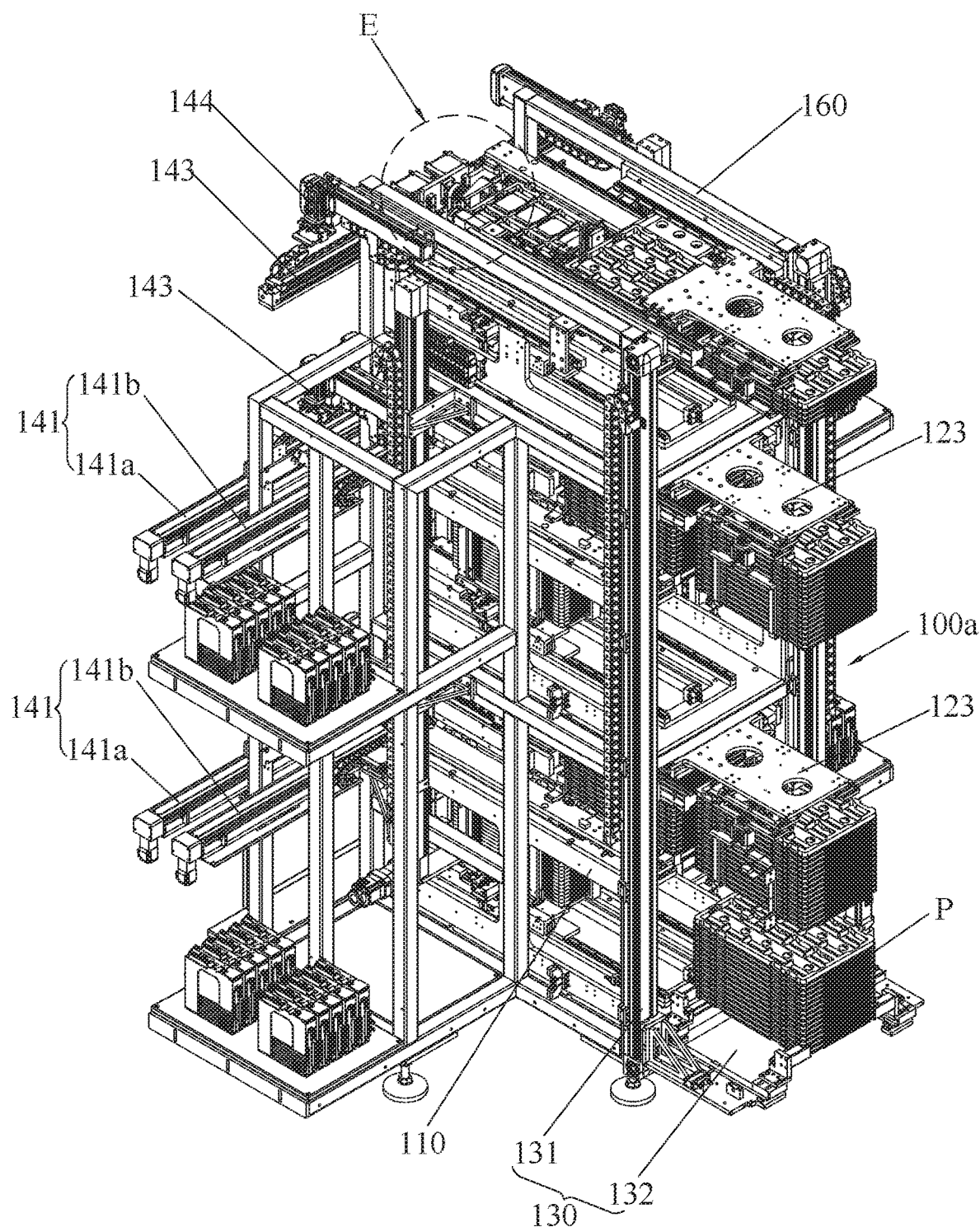
FIG. 6 is a perspective view of a sorting and feeding device according to the present invention.
Figure 9:
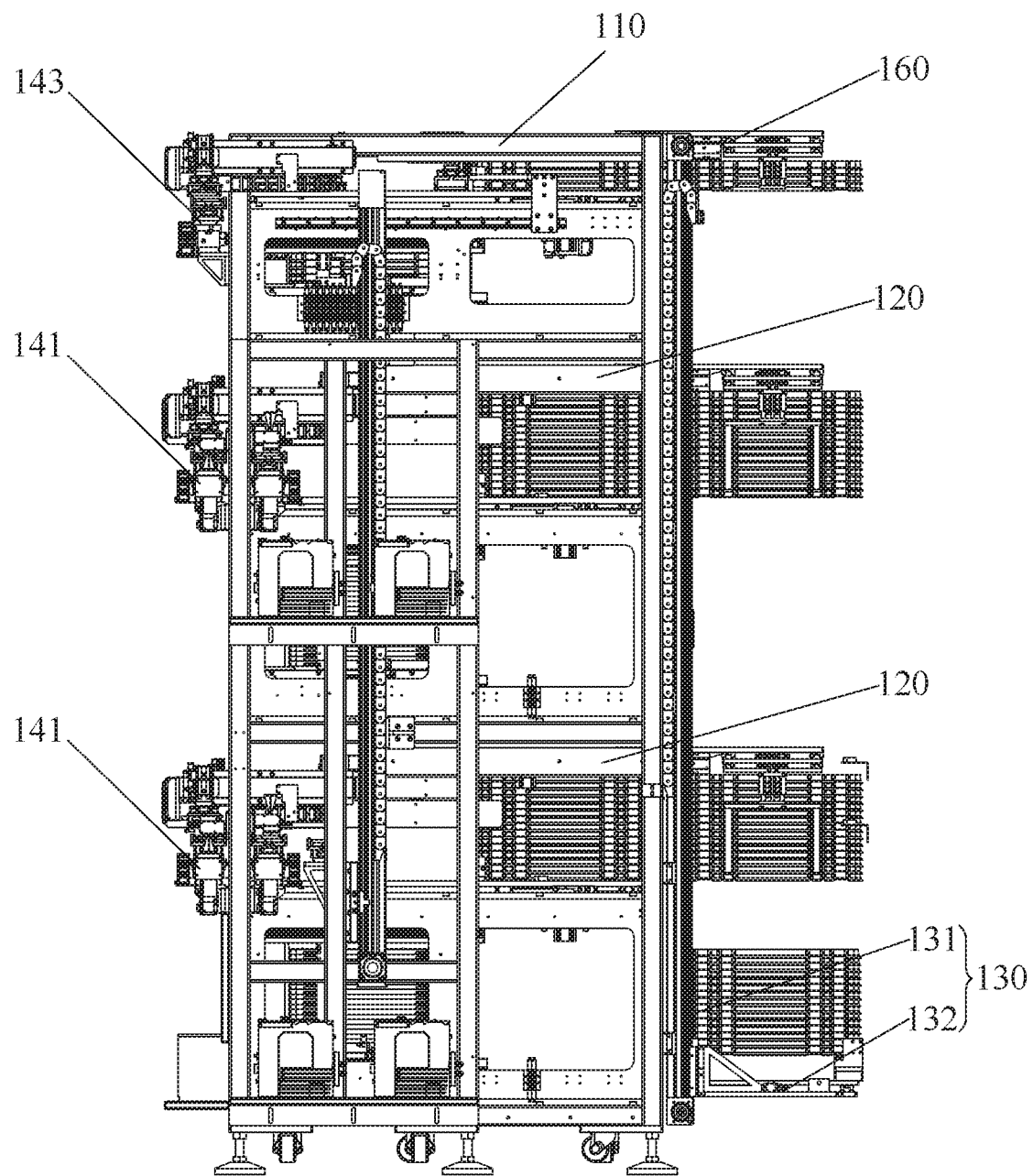
FIG. 9 is a side view of the sorting and feeding device according to the present invention.

Referring to FIGS. 6-9, structure of the sorting and feeding device 100 is described:

As shown in FIGS. 6 and 9, the sorting and feeding device 100 cooperates with the transfer device 200 to load and unload the solid state disk S to solid state disk test systems a00. The sorting and feeding device 100 includes a support frame 110, a feeding mechanism 120, a loading and unloading mechanism 130, and a pushing mechanism. Specifically, a front side of the support frame 110 is provided with the pushing mechanism, and a rear side of the support frame 110 is provided with the loading and unloading mechanism 130. At least two feeding mechanisms 120 are vertically arranged in the support frame 110, and the loading and unloading mechanism 130 can move up and down relative to the support frame 110 to respectively load and unload for the feeding mechanism 120. The pushing mechanism includes a transfer line 141 that cooperates with either of the feeding mechanisms 120 and the transfer device 200. Specifically as follows:

As shown in FIG. 6, the sorting and feeding device 100 includes a support frame 110, a feeding mechanism 120, a loading and unloading mechanism 130, a pushing mechanism, a sorting mechanism 150, and a defective product recycling mechanism 160. Concretely, the pushing mechanism is disposed on the front side of the support frame 110 close to the transfer device 200 and protruded from the solid state disk test system a00. The pushing mechanism includes a transfer line 141 extending towards the transfer device 200 to transfer the solid state disk S between the sorting and feeding device 100 and the transfer device 200. At least two feeding mechanisms 120 are vertically arranged in the support frame 110, and the feeding mechanism 120 and the transfer line 141 are correspondingly disposed. The loading and unloading mechanism 130 is disposed on the rear side of the support frame 110 to supply solid state disks S to the feeding mechanism 120 or to pull out the tested solid state disk S. The defective product recycling mechanism 160 is also disposed in the support frame 110 for recycling defective solid state disks S, and the sorting mechanism 150 is located at the transfer line 141 for identifying the solid state disk S and transferring the identified solid state disk S to the defective product recycling mechanism 160.

Figure 8:
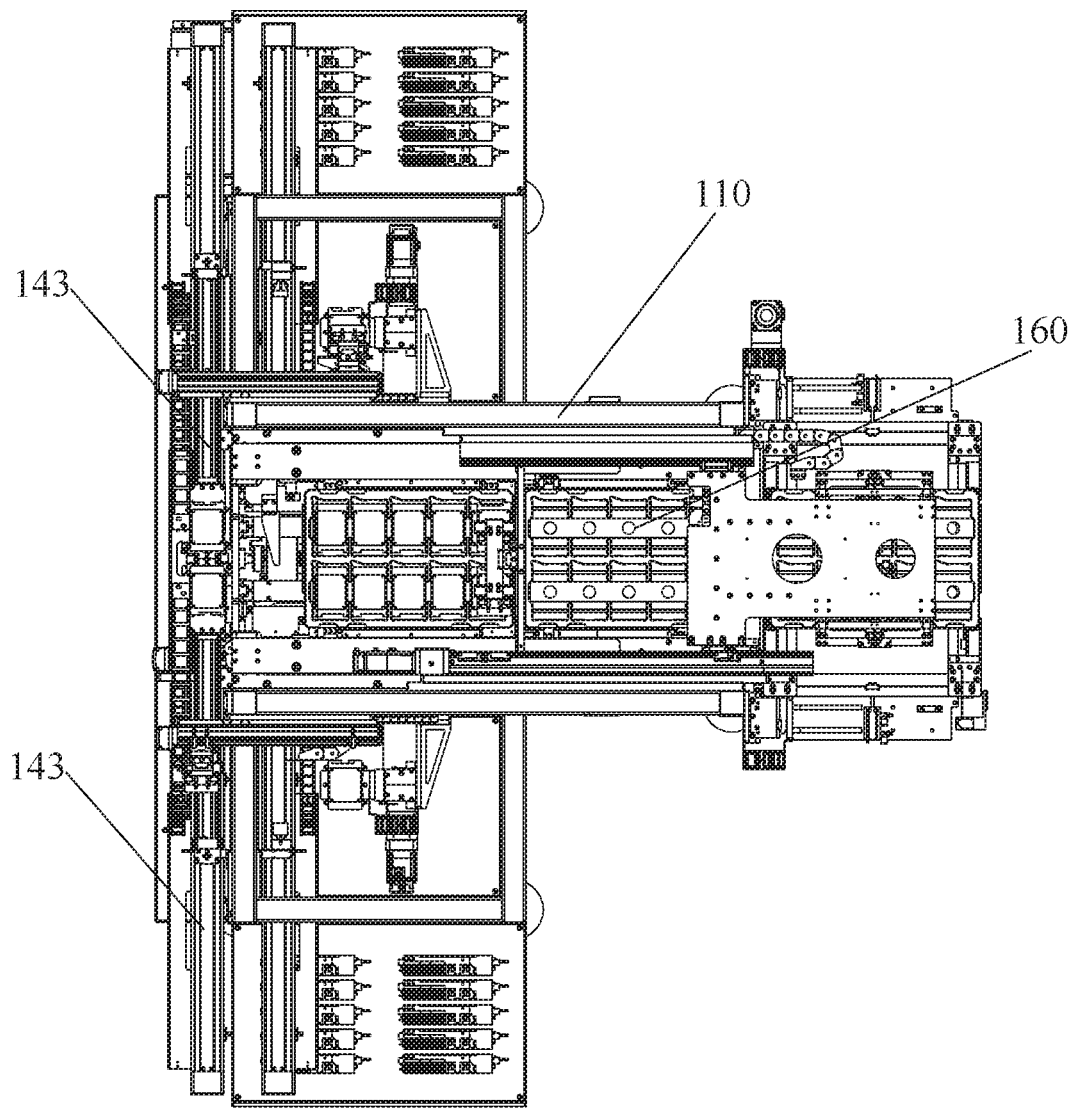
FIG. 8 is a top plan view of the sorting and feeding device according to the present invention.

Referring to FIGS. 6, 8 and 9, the support frame 110 has a cubic frame structure, which is divided into three layers from top to bottom. Concretely, a middle layer and a lower layer of the support frame 110 are respectively provided with one feeding mechanism 120, and the two feeding mechanisms 120 are vertically arranged; and an upper layer of the support frame 110 is provided with a defective product recycling mechanism 160. A loading and unloading position 100a is located at a rear side of the sorting and feeding device 100 away from the transfer device 200 and the test position a10, which loads or unloads the solid state disks S to the feeding mechanism 120, and carries the defective solid state disks S recycled by the defective product recycling mechanism 160. The pushing mechanism is located at a front side of the sorting and feeding device 100 close to the transfer device 200 and the test position a10, which transfers the solid state disks S from the feeding mechanism 120 to the transfer device 200.

As shown in FIG. 6, the loading and unloading mechanism 130 is disposed on a rear side of the support frame 110 away from the transfer device 200 and the test position a10. The loading and unloading mechanism 130 includes a vertical guide rail 131 and a support plate 132. Concretely, the guide rail 131 is disposed on both sides of the frame of the support frame 110, and the support plate 132 is slidably mounted to the guide rail 131. The support plates 132 are vertically moved along the guide rails 131 driven by a power unit (not shown). Specifically, the support plate 132 is vertically moved by the power unit to the middle layer or the lower layer of the support frame 110, which carries the stacked trays P with solid state disks S to the corresponding feeding mechanism 120, or receives the stacked trays P at the feeding mechanism 120; the support plate 132 is vertically moved to the upper layer of the support frame 110 driven by the power unit, which transfers the stacked trays P to the corresponding defective product recycling mechanism 160, or receives the stacked trays P with defective solid state disk S from the defective product recycling mechanism 160. It can be understood that the stacked tray P at the support plate 132 can be manually picked up and placed, or can be picked up and placed by an external device.

Figure 14:
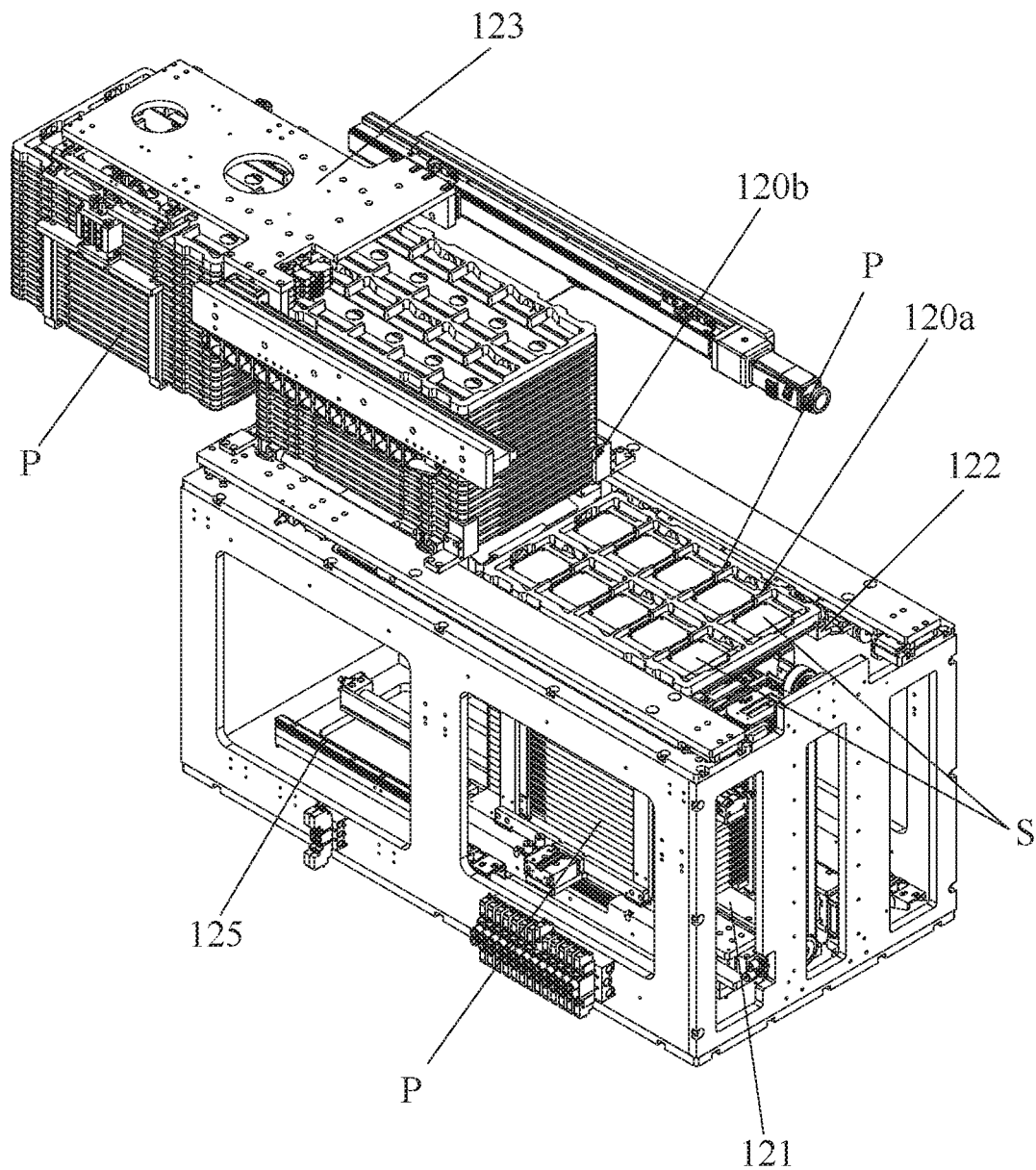
FIG. 14 is a perspective view of a feeding mechanism according to the present invention.
Figure 15:
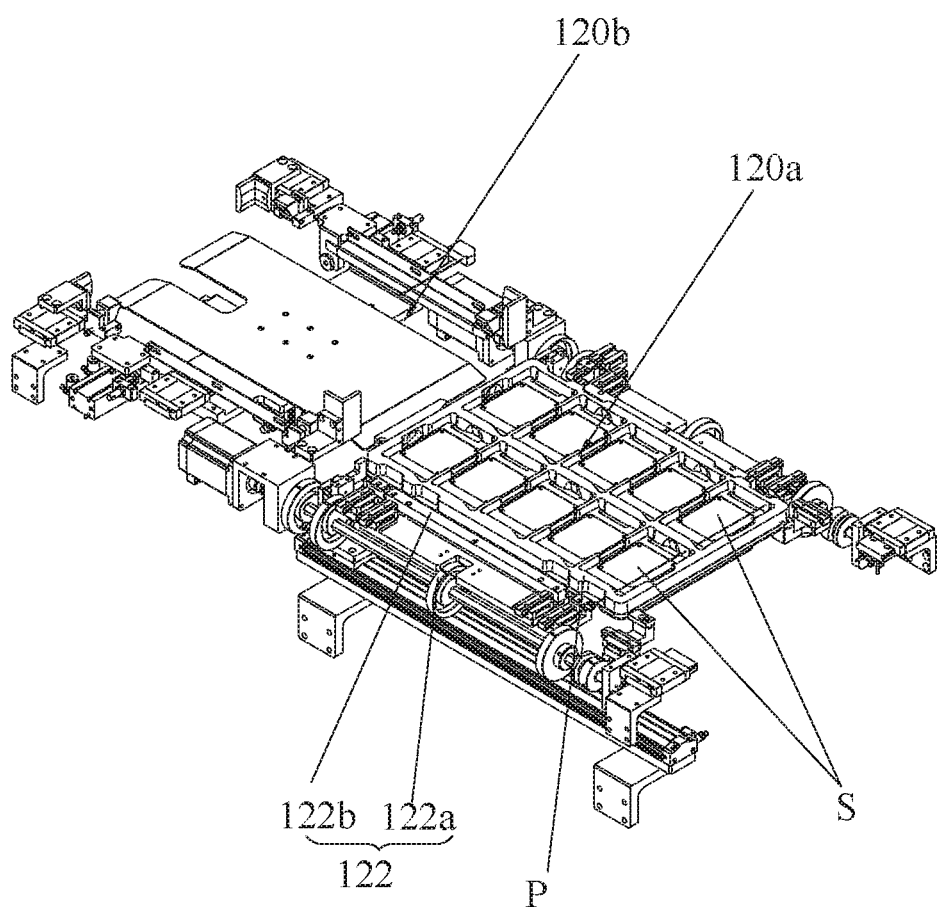
FIG. 15 is a perspective view of a tray lifting unit according to the present invention.

Referring to FIGS. 6 and 14, the feeding mechanism 120 has a double-layer structure. The loading plate 121, which is disposed on a lower layer, slides between the front and rear sides of the support frame 110. The loading plate 121 slides to receive the stacked tray P with the solid state disk S to be tested supplied by the loading and unloading mechanism 130. A solid state disk loading position 120a and a tray stacking position 120b, which are disposed on the upper layer, are disposed along a front-rear direction of the support frame 110. A tray lifting unit 122 is disposed at the solid state disk loading position 120a, and the tray stacking unit 123 is disposed at the tray stacking position 120b. Specifically, the tray lifting unit 122 lifts the trays on the loading plate 121 to the solid state disk loading position 120a, and the tray stacking unit 123 supports and stacks the trays at the tray stacking position 120b. The loading and unloading mechanism 130 carries on the trays P stacked by the stacking unit 123.

It can be understood, in this embodiment, the feeding mechanism 120 has a frame structure, and the feeding mechanism 120 is divided into the upper and lower double-layer structures by the frame structure. In other embodiments, the feeding mechanism 120 may not have a frame structure. The loading plate 121, the tray lifting unit 122, and the tray stacking unit 123 are fixed to the middle layer or the lower layer of the support frame 110 at different height, which also defines an upper and lower double-layer structure for the feeding mechanism 120.

More specifically, as shown in FIG. 14, the lower layer of the feeding mechanism 120 is provided with a guide rail 125 along the front and rear direction of the support frame 110. The loading plate 121 is slid along the guide rail 125 to the rear side of the support frame 110 for receiving the trays P from the loading and unloading mechanism 130. Or, the loading plate 121 is slid along the guide rail 125 to the front side of the support frame 110 for supplying the trays P to the solid state disk loading position 120a. Specifically, when the loading plate 121 is slid along the guide rail 125 to the rear side of the support frame 110 driven by the power unit (not shown), the loading plate 121 is horizontal with the support plate 132; then the loading plate 121 receives the stacked tray P with the solid state disks S to be tested; subsequently the loading plate 121 is slid along the guide rail 125 to the front side of the support frame 110 driven by the power unit and faces a lower side of the solid state disk loading position 120a.

More specifically, referring to FIG. 14 again, the upper layer of the feeding mechanism 120 is provided with two tray carrying positions along a front-rear direction of the support frame 110. One of the tray carrying positions is the solid state disk loading position 120a, which is located at the front side of the support frame 110 near the transfer device 200 and the test position a10. The pushing mechanism takes the solid state disk S one by one from a single tray P located at the loading position 120a. Another tray carrying position is the tray stacking position 120b, which is located at the rear side of the support frame 110 away from the transfer device 200 and the test position a10. When solid state disks S on the single tray P, which is located at the loading position 120a, are completely removed, the tray P is moved by the cylinder or motor to the tray stacking position 120b for stacking these trays.

Further, the feeding mechanism 120 is provided with an escape hole on the solid state disk loading position 120a. The tray lifting unit 122 includes a cam assembly 122a respectively disposed on left and right sides of the escape hole, and lifting members 122b respectively driven by the cam assembly 122a. When driven by the cam assembly 122a, the lifting member 122b pulls the tray P at the loading plate 121 upward to the solid state disk loading position 120a. The tray lifting unit 122 can split one by one the stacking trays P loaded with the solid state disk S to be tested which is located at the lower layer of the feeding mechanism 120 and on the loading plate 121. Subsequently, the tray P is lifted upward to the solid state disk loading position 120a. Thus, this enables the pushing mechanism to take out the solid state disk S one by one from the solid state disk loading position 120a to load the solid state disk S. At the same time, the pushing mechanism can also put the tested solid state disk S into the tray P which is vacant due to the removal of the solid state hard disk S, so as to unload the solid state disk S. Preferably, the cam assemblies 122a, which is respectively disposed on the left and right sides of the escape hole, are synchronously driven by the same drive unit, so that the left and right sides of the lifting member 122b are balanced.

Further, for the tray P at the solid state disk loading position 120a, when the solid state disks S to be tested are completely removed and the tested solid state disk S are placed, the tray P with solid state disks S is unloaded. Specifically, the tray stacking unit 123 lifts the stacked tray P at the tray stacking position 120b to form a tray accommodation between the solid state disk loading position 120a and the stacked tray P. The feeding mechanism 120 is further fixedly provided with a pushing member which is located on a side of the solid state disk loading position 120a away from the tray stacking position 120b. Specifically, the pushing member pushes the stacked tray P at the solid state disk loading position 120a to the tray stacking position 120b. According to this configuration, the pushing member urges the tray P, which is loaded with the tested solid state hard disk S at the solid state disk loading position 120a, to enter the tray stacking position 120b and is below the stacked tray P. After the stacking unit 123 finishes lifting the stacked tray P, the stacked tray P moves downward, so that the newly added tray P below is stacked. Referring to FIG. 14 again, the stacking unit 123 can move along a front-rear direction of the support frame 110, which transfers the stacked tray P at the tray stacking position 120b to the loading and unloading mechanism 130, thereby unloading the solid state disk S.

Referring to FIGS. 6, and 8-9, the pushing mechanism is located at the side of the feeding mechanism 120 close to the transfer device 200 and protruded from the solid state disk test system a00. Further, the pushing mechanism includes a transfer line 141 extending towards the transfer device 200, which transfers the solid state disks S between the sorting and feeding device 100 and the transfer device 200. Specifically, the transfer line 141 is located on the front side of the feeding mechanism 120 and facing the solid state disk loading position 120a; and one end of the transfer line 141 is fixedly connected to the support frame 110, and the other end of the transfer line 141 stretches out towards the transfer device 200. Specifically, in this embodiment, the number of the transfer lines 141 is four in total. The feeding mechanism 120 and the transfer line 141 are arranged in one-to-two correspondence. For one feeding mechanism 120, a cantilever-shaped transfer line 141 is protruded outwardly from the left and right sides of the front side of the solid state disk loading position 120a. And the conveying direction of the transfer line 141 is horizontal and vertical to a longitudinal direction of the feeding mechanism 120. The transfer line 141 conveys the solid state disk S between the transfer device 200 and the feeding mechanism 120, effectively improving transfer efficiency of the solid state disk S, which makes it possible that one sorting and feeding device 100 supplies the solid state hard disk S to a plurality of solid state disk test systems a00.

Referring to FIGS. 6 and 8, any one of the transfer lines 141 includes a loading transfer line 141a and an unloading transfer line 141b arranged in parallel. The pushing mechanism is provided with a pushing robot 142 at an end of the transfer line 141 close to the solid state disk loading position 120a. The pushing robot 142 transfers the solid state disks S on the solid state disk loading position 120a to the loading transfer line 141a; and the pushing robot 142 transfers the tested solid state disks S by the unloading transfer line 141b. Specifically, the number of the pushing robot 142 is also four. The four pushing robots 142 and the four transfer lines 141 are in one-to-one correspondence, which respectively takes out the solid state disks S from the tray P loaded with the solid state disk S, and then respectively transfers them to the corresponding loading transfer line 141a on the left and right sides. Subsequently, the tested solid state disks S are taken from the unloading transfer line 141b and transferred to the tray P.

Referring again to FIGS. 1 and 3, it can be understood that an upper side of the transfer line 141 is further provided with a sorting mechanism 150. In this embodiment, the sorting mechanism 150 has dual functions of detecting and picking out solid state disks S. A detecting-sorting mechanism 151 with the detecting function may be a scanning mechanism or an image detecting mechanism. By performing scan code detection or image detection on the solid state disk S by the detecting-sorting mechanism 151, the defective solid state disks S are detected. The defective productions include the solid state disks S that are inconsistent with the current model of the solid state disks, and the defective product. A discharge unit 152 may be a clamping jaw, which picks out the defective solid state disks S. The discharge unit 152 takes out the detected defective solid state disks and the solid state disks whose specifications are inconsistent with the current model of the solid state disks, and transfers the defective product to the defective product recycling mechanism 160. Or the discharge unit 152 only removes and transfers the defective solid state disks to the defective product recycling mechanism 160, and the solid state disks, whose specifications are inconsistent with the current model of the solid state disk, will be retested.

Figure 7:
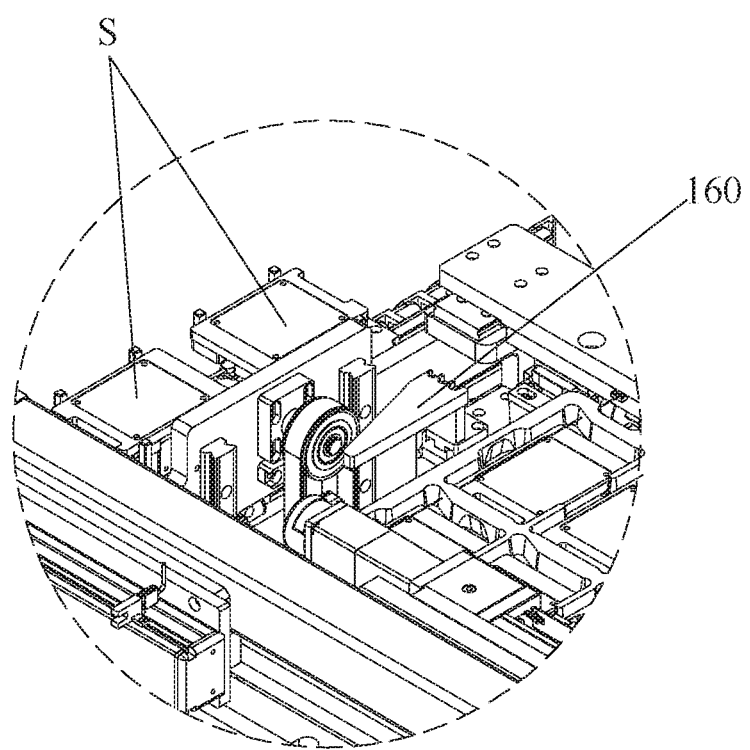
FIG. 7 is a partial enlarged view of portion E in FIG. 6.

As shown in FIG. 6 and FIG. 7, in order to discharge the defective solid state disks S and the solid state disks S whose specifications are inconsistent, the pushing mechanism further includes a defective product recycling line 143 in addition to the transfer line 141 corresponding to the feeding mechanism 120. The defective product recycling line 143 is the same as the above-described transfer line 141, namely, each of the defective product recycling mechanisms 160 corresponds to two defective product recycling lines 143. Both defective product recycling lines 143 are located above the transfer line 141 and are parallel to a conveying direction of the transfer line 141. Different from the transfer line 141, the defective product recycling line 143 has only a single line that flows unidirectionally from the transfer device 200 to the defective product recycling mechanism 160. The defective product discharged by the discharge unit 152 is transferred to the defective product recycling line 143, and transferred to the defective product recycling mechanism 160 via the defective product recycling line 143. As shown in FIG. 6, a defective product recycling robot 144 moves between the defective product recycling line 143 and the defective product recycling mechanism 160 to transfer the defective solid state disks.

It can be understood that the loading and unloading mechanism 130 disposed on the rear side of the support frame 110 moves up and down relative to the support frame 110. The loading and unloading mechanism 130 passes through the middle layer and the lower layer of the support frame 110; the loading and unloading mechanism 130 transfers the stacked tray P loaded with the solid state disk S to be tested to the feeding mechanism 120; and the loading and unloading mechanism 130 also carries the stacked tray P loaded with the tested solid state disk S from the feeding mechanism 120. Further, the loading and unloading mechanism 130 can also move up and down relative to the support frame 110 and reach to the upper layer of the support frame 110, which pushes the empty tray P to the defective product recycling mechanism 160 or carries on the defective solid state disk and/or the solid state disks, whose specifications are inconsistent with the current model of the solid state disk. The structure of the defective product recycling mechanism 160 can be referred to the feeding mechanism 120. However, it can be understood, the defective solid state disks or the solid state disks, whose specifications are inconsistent with the current model of the solid state disk, are few. So the number of the stacked trays P may be slightly less, and the vertical size of the defective product recycling mechanism 160 may be thinner.

As shown in FIG. 10, the transfer mechanism 200 includes a rack 211, a top and bottom beam 212, and a drive member (not shown). The rack 211 is laterally fixedly disposed on upper and lower sides of the solid state disk test system a00, the top and bottom beam 212 is respectively engaged with opposite ends of the rack 211, and the drive member drives the top and bottom beam 212 to mesh with the rack and transfer. An insert and extract robot 220 is movably connected to the top and bottom beam 212. Specifically, the transfer device 200 has an outer frame 230. The solid state disk test system a00 is disposed in the outer frame 230. At the front side of the solid state disk test system a00 with the test position a10, the upper and lower sides of the outer frame 230 are respectively disposed with a horizontal rack 211. The upper and lower ends of the top and bottom beam 212 are respectively engaged with the rack 211, and are laterally moved relative to the rack 211 by the drive member. The insert and extract robot 220 is connected to one side of the top and bottom beam 212 with the test position a10. The insert and extract robot 220 can move up and down along the top and bottom beam 212. The clamping jaw of the insert and extract robot 220 can move back and forth relative to the top and bottom beam 212 to approach or keep away from the test position a10. According to this configuration, the insert and extract robot 220 receives the solid state disk S from the loading transfer line 141a and inserts it into an empty test position a10; and after the solid state disk S finishes being tested, it is pulled out from the test position a10 to be transferred to the unloading transfer line 141b, thereby loading and unloading the solid state disks S.

Figure 13:
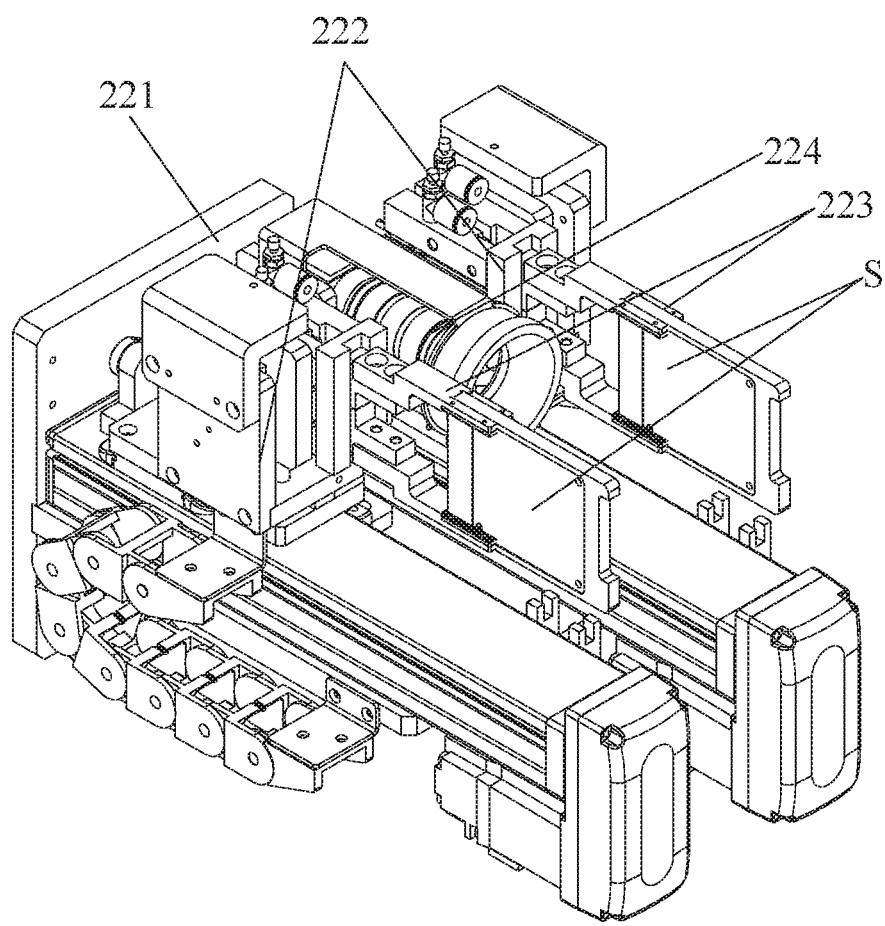
FIG. 13 is a perspective view of an insert and extract robot according to the present invention.

As shown in FIG. 13, the insert and extract robot 220 includes a connecting plate 221 movably mounted to the top and bottom beam 212, and a front and rear driving unit 222 disposed on a side of the connecting plate 221 facing the test position a10. A pick-and-place jaw 223 is driven by the top and bottom beam 212, the insert and extract robot 220, or the front and rear driving unit 222, thereby inserting the solid state disk S into the test position a10 or removing the solid state disk S from the test position a10. Specifically, in this embodiment, the pick-and-place jaws 223 are symmetrically disposed in two. Preferably, the insert and extract robot 220 further includes a position detecting unit 224. The position detecting unit 224 is arranged between two pick-and-place jaws 223 for detecting and calibrating position and state of the test position a10, so that the insert and extract robot 220 inserts the solid state disk S into the test position a10 or remove the solid state disk S from the test position a10.

Referring to FIGS. 1, 4, and 10-11, the transfer device 200 further includes a transfer robot 214. A plurality of the transfer robots 214 are connected to vertical rods on the side of the outer frame 230 towards the transfer line 141, or connected to intermediate rods of the outer frame 230. A plurality of transfer robots 214 transfer cooperatively the solid state disks S between the transfer line 141 and the insert and extract robot 220.

Preferably, the opposite ends of the top and bottom beam 212 are respectively provided with rollers 215 which are rotatable relative to the top and bottom beam 212. Cylindrical pins 215a are arranged circumferentially around an outer edge of the roller 215 with the top and bottom beam 212 as a center. When the drive member drives the top and bottom beam 212 to move laterally, the top and bottom beam 212 moves by engagement of the cylindrical pin 215a and the rack 211.

The working process of the loading and unloading device for a solid state disk test system is as follows:

The support plate 132 is driven to move up and down along the guide rail 131 to a preset height by a power unit (not shown), so that the stacked tray P loaded with solid state disks S to be tested is placed on the support plate 132 by manual or external mechanism.

The support plate 132 is moved up and down along the guide rail 131 to the middle or lower layer of the support frame 110 under the driving of a power unit (not shown). At this time, the support plate 132 and the loading plate 121 are substantially horizontal for transferring the stacked tray P loaded with the solid state disks S to be tested to the loading plate 121.

Subsequently, the support plate 132 is moved up and down along the guide rail 131 under the driving of a power unit (not shown); the stacked tray P loaded with the solid state disks S to be tested is sequentially transferred to loading plate 121 of another feeding mechanism 120; and the empty tray is transferred to the defective product recycling mechanism 160.

At the same time, the loading plate 121 is slid along the guide rail 125 and reaches the front side of the support frame 110 under the driving of the corresponding power unit (not shown), and the loading plate 121 moves below the solid state disk loading position 120a; and the lifting member 122b is driven by the cam assembly 122a, the tray P at the loading plate 121 is lifted upwards the solid state disk loading position 120a.

The four pushing robots 142 respectively takes out the solid state disks S from the tray P loaded with the solid state disks S, and then respectively transfers them to the corresponding loading transfer line 141a on the left and right sides. Subsequently, the tested solid state disk S is taken from the unloading transfer line 141b and transferred to the tray P.

The solid state disk S to be tested moves towards the transfer device 200 along the loading transfer line 141a, then sequentially passes through the sorting mechanism 150. By performing scan code detection or image detection on the solid state disk S by detecting-sorting mechanism 151, the defective productions are detected. The defective productions include the solid state disks S that are inconsistent with the current model of the solid state disk, and the tested defective product. Then, according to the test result, the discharge unit 152 takes out the detected defective solid state disks and the solid state disks whose specifications are inconsistent with the current model of the solid state disk, and transfers defective product to the defective product recycling mechanism 160. Or the discharge unit 152 only removes and transfers the defective solid state disks to the defective product recycling mechanism 160, and the solid state disks, whose specifications are inconsistent with the current model of the solid state disk, will be retested.

The solid state disks S to be tested, which reach one end of the loading transfer line 141a near the transfer device 200, are in groups of two. The solid state disks S is transferred by a plurality of transfer robots 214 until it is transferred to the insert and extract robot 220. Subsequently, the solid state disk S is held by the pick-place jaws 223. The pick-and-place jaw 223 moves laterally driven by the top and bottom beam 212, moves vertically driven by the insert and extract robot 220, and longitudinally driven by the front and rear driving unit 222, thereby inserting the solid state disk S into the test position a10 and removing the tested solid state disk S from the test position a10.

After the solid state disks S to be tested in the tray P at the solid state disk loading position 120a are completely used up, and the tested solid state disks S are placed in the tray P, for unloading the tray P with the tested solid state disks S. The tray stacking unit 123 lifts the stacked tray P at the tray stacking position 120b, which forms a tray accommodation between the solid state disk loading position 120a and the stacked tray P. The feeding mechanism 120 is further fixedly provided with a pushing member, which is located on a side of the loading position 120a away from the tray stacking position 120b. Specifically, the pushing member is used for pushing the stacked tray P at the loading position 120a to the tray stacking position 120b. The tray stacking unit 123 moves the stacked tray P at the tray stacking position 120b to the loading and unloading mechanism 130, thereby unloading the solid state disk S.

In comparison with the prior art, the sorting and feeding device 100 of the loading and unloading device is disposed in parallel with the solid state disk test system a00 to reduce space occupied. Besides, a transfer device 200 is disposed on a side of the solid state disk test system a00 provided with a test position a10, which can detect test status on various test positions a10 of the solid state disk test system a00. According to test status on various test positions a10, the transfer device 200 inserts solid state disk into the test position a10 to load; or the transfer device 200 pulls out the tested solid state disk S from the test position a10 to unload. The loading and unloading device for solid state disk test system can selectively insert and pull out solid state disks S according to test status on various test positions a10, so as to load and unload of the solid state disks S. It is highly effective and highly automated.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A loading and unloading device for a solid state disk test system, adapted to insert and extract solid state disks at a test position of a solid state disk test system, comprising:
    a sorting and feeding device disposed in parallel with the solid state disk test system; and
    a transfer device disposed on a side of the solid state disk test system provided with a test position;
    wherein a loading and unloading position is located at a side of the sorting and feeding device away from the transfer device, the sorting and feeding device transfers a solid state disk to be tested from the loading and unloading position to a side close to the transfer device, and transfers the tested solid state disk back to the loading and unloading position, the transfer device comprises a transfer mechanism and an insert and extract robot, and the transfer mechanism drives the insert and extract robot to move relative to the test position, which inserts the solid state disk to be tested into the test position, or pulls out the tested solid state disk to transfer to the transfer device.

2. The loading and unloading device for a solid state disk test system according to claim 1, wherein the sorting and feeding device is disposed between the solid state disk test systems whose number is at least two, and the transfer devices are respectively disposed on a side of the solid state disk test system provided with the test position.

3. The loading and unloading device for a solid state disk test system according to claim 2, wherein the sorting and feeding device comprises a pushing mechanism, the pushing mechanism is located at a side of the sorting and feeding device close to the transfer device and protruded from the solid state disk test system, and the pushing mechanism comprises a transfer line extending towards the transfer device, which transfers the solid state disk between the sorting and feeding device and the transfer device.

4. The loading and unloading device for a solid state disk test system according to claim 3, wherein the transfer line comprises a loading transfer line and an unloading transfer line arranged in parallel, and the pushing mechanism is provided with a pushing robot at an end of the transfer line away from the transfer device, which transfers the solid state disk to the loading transfer line and/or the unloading transfer line.

5. The loading and unloading device for a solid state disk test system according to claim 3, wherein the transfer line comprise a loading transfer line and an unloading transfer line, and the loading transfer line is provided with a sorting mechanism for identifying the solid state disk and transferring the identified solid state disk to a defective product recycling mechanism.

6. The loading and unloading device for a solid state disk test system according to claim 3, wherein the sorting and feeding device comprises a feeding mechanism, at least two feeding mechanisms are arranged vertically, and the feeding mechanism and the transfer line are arranged in one-to-one correspondence, and the pushing robot transfers the solid state disk between the transfer line and the feeding mechanism.

7. The loading and unloading device for a solid state disk test system according to claim 6, wherein the sorting and feeding device further comprises a defective product recycling mechanism, wherein the defective product recycling mechanism and at least two feeding mechanisms are vertically arranged, and the defective product recycling mechanism is located above at least two feeding mechanisms; and the sorting and feeding device further comprises a defective product recycling line, a defective product recycling robot moves between the defective product recycling line and the defective product recycling mechanism to transfer the defective solid state disk.

8. The loading and unloading device for a solid state disk test system according to claim 1, wherein the transfer mechanism comprises a rack, a top and bottom beam, and a drive member, the rack is laterally fixedly disposed on upper and lower sides of the solid state disk test system, opposite ends of the top and bottom beam are respectively engaged with the rack, and the drive member drives the top and bottom beam to mesh with the rack to transfer, and the insert and extract robot is movably coupled to the top and bottom beam.

9. The loading and unloading device for a solid state disk test system according to claim 8, wherein the opposite ends of the top and bottom beam are respectively provided with rollers which are rotatable relative to the top and bottom beam, and a plurality of cylindrical pins are arranged circumferentially around an outer edge of the roller with the top and bottom beam as a center; and when the drive member drives the top and bottom beam, the top and bottom beam moves by engagement of the cylindrical pin and the rack.

10. The loading and unloading device for a solid state disk test system according to claim 5, the transfer device further comprises a transfer robot which is movable up and down and respectively cooperates with the transfer line or the insert and extract robot, which transfers the solid state disk to the insert and extract robot or transfers the tested solid state disk back to the transfer line.

* * * * *